(12) United States Patent  
Pallinti et al.

(10) Patent No.: US 7,205,673 B1  
(45) Date of Patent: Apr. 17, 2007

(54) REDUCE OR ELIMINATE IMC CRACKING IN POST WIRE BONDED DIES BY DOPING ALUMINUM USED IN BOND PADS DURING CU/LOW-K BEOL PROCESSING

(75) Inventors: Jayanthi Pallinti, Santa Clara, CA (US); Dilip Vijay, Redwood City, CA (US); Hemanshu Bhatt, Vancouver, WA (US); Sey-Shing Sun, Portland, OR (US); Hong Ying, Cupertino, CA (US); Chiyi Kao, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/283,044

(22) Filed: Nov. 18, 2005

(51) Int. Cl.  
*H01L 23/48* (2006.01)  
*H01L 23/52* (2006.01)  
*H01L 29/40* (2006.01)

(52) U.S. Cl. ............... 257/786; 257/E23.021; 257/E23.025; 257/E23.024; 257/E23.078; 257/E25.011; 257/E25.029; 257/784; 257/735; 257/762; 257/737; 257/738; 257/690

(58) Field of Classification Search .......... 257/E23.02, 257/E23.025, E23.023, E23.078, E25.011, 257/E25.029, 735, 734, 737, 738, 690, 774, 257/773  
See application file for complete search history.

(56) References Cited

U.S. PATENT DOCUMENTS

| | | | |
|---|---|---|---|
| 6,110,823 A * | 8/2000 | Eldridge et al. ............ 438/660 |
| 6,232,662 B1 * | 5/2001 | Saran ......................... 257/750 |
| 6,384,486 B2 * | 5/2002 | Zuniga et al. .............. 257/781 |
| 6,413,851 B1 * | 7/2002 | Chow et al. ................ 438/613 |
| 6,507,041 B2 * | 1/2003 | Nakamura et al. ........... 257/13 |
| 6,515,373 B2 * | 2/2003 | Barth ......................... 257/781 |
| 6,703,069 B1 * | 3/2004 | Moon et al. ................ 427/123 |
| 6,854,637 B2 * | 2/2005 | Harun et al. ............. 228/180.5 |
| 6,936,923 B2 * | 8/2005 | Lin et al. .................... 257/750 |
| 6,998,690 B2 * | 2/2006 | Nakamura et al. .......... 257/431 |
| 2006/0091536 A1 * | 5/2006 | Huang et al. ............... 257/734 |

* cited by examiner

*Primary Examiner*—Alexander Oscar Williams  
(74) *Attorney, Agent, or Firm*—Trexler, Bushnell, Giangiorgi, Blackstone & Marr, Ltd.

(57) ABSTRACT

A bond pad structure which includes an aluminum bond pad which include one or more dopants that effectively control the growth of IMC to a nominal level in spite of high tensile stresses in the wafer. For example, aluminum can be doped with 1–2 atomic % of Mg. Alternatively, Pd or Si can be used, or elements like Cu or Si can be used as the dopant in order to reduce the overall tensile stresses in the wafer. This can control the abnormal growth of IMC, thus arresting the IMC crack formation. A combination of dopants can be used to both control the tensile stresses and also slightly alter the gold-Aluminum interface thus enabling a uniform and thin IMC formation. This tends to reduce or eliminate any voiding or cracking which would otherwise occur at the wire bond transfer.

3 Claims, 2 Drawing Sheets

REDUCE OR ELIMINATE IMC CRACKING IN POST WIRE BONDED DIES BY DOPING ALUMINUM USED IN BOND PADS DURING CU/LOW-K BEOL PROCESSING

BACKGROUND

The present invention generally relates to wire bonds, and more specifically relates to pad structures and passivation schemes to reduce or eliminate IMC cracking in post wire bonded dies during Cu/Low-K BEOL processing.

It has been observed that some post wire bonded dies that have undergone Cu/Low-K metallization show signature of 'open' fails after several hours of HTS (high temperature storage). Failure analysis on such parts shows cracks at the interface of intermetallic compound (IMC) and gold bond. FIG. 1 shows an X-SEM of a bonded die with IMC cracking.

Historically, IMC cracking in Au—Al wirebonds have been attributed to several causes including contamination on the surface of the Al-pads, incompatible film properties of the Al-films, presence of halides in the molding compounds, excessive levels of voids in the molding compounds and poorly optimized bonding and molding conditions. However, in the case of wire bond devices with Cu/Low-k metallization, the cracking of IMC persists despite careful control of the above-mentioned factors. Through a cumulative set of deductive experiments and use advanced analytical techniques, it has been determined that the cracking of IMC wire bond devices with Cu/Low-k metallization is a strong function of the tensile stresses in the film. It has been found that the unusually high tensile stresses generated in the Cu/Low-K stacks can drive excessive diffusion of Al into the Au bonds leading to very thick and Al-rich IMC phases. The unstable Al-rich phases eventually undergo reverse phase transformations to Au-rich phases; the associated volume change (very large~30%) in such phase transformations can result in voiding and eventual cracking of the IMC. The way to prevent this issue then is to tailor the stresses in the Cu/Low-K stacks so that the Al-diffusion rates are controlled to a low enough level that the stable Au-rich phases are formed preferably when compared to Al-rich phases. This will prevent any tendencies for phase transformation in the system.

Stress Build-Up:

The present invention addresses the stress related issues that cause the IMC cracking and methods to eliminate the IMC cracking by controlling the macro stresses in the wafer. During Cu/Low-k processing, it has been found that there is cumulative stress buildup in wafers due to intrinsic stresses in metal and dielectric films and due to various thermal cycles. Thermal stresses are generated due to a mismatch between the temperature coefficients of expansion between metal, dielectric films and substrate, as illustrated in the following table:

| Material | Coefficient of thermal expansion for various film (per degree Celsius) |
|---|---|
| Al | 2.2E–05 |
| Cu | 1.7E–05 |
| Ti/TiN | 9.0E–06 |
| Ta/TaN | 6.0E–06 |
| Si | 3.0E–06 |
| $SiO_2$ | 5.5E–07 |

Intrinsic stresses are generated during deposition. The stress state can be evaluated with freestanding films (or films on flexible substrates). Some general observations regarding stresses in thin films is provided below for reference:

1. Tensile: typically, an upward curve is generated due to repulsive forces between tapered grains in zone 1 structure formed by evaporation or sputtering with high pressure and low power.
2. Compressive: typically, a downward curve is generated due to atomic peening of crystal grains by reflected neutrals during sputtering.
3. Metals with Body Centered Cubic (BCC) structure, e.g., W, Ta (mostly refractory metals), can have extremely high compressive stress due to open lattice that allows atoms to be easily displaced.
4. Metals with Face Centered Cubic (FCC) structure, e.g., Cu, Al and Au (most noble metals), have very little intrinsic stress (low re-crystallization temperature).
5. Dielectric (CVD) films can be tensile or compressive depending on deposition parameters, e.g., temperature and plasma power.

The macro stresses in the wafer can be measured by measuring the bow in the wafer and translating the values to stresses through Poisson's equations. In general, a positive wafer gap during the wafer bow measurement indicates tensile stresses in the wafers and a negative wafer gap indicates compressive stresses. FIG. 2 shows a normalized graph with stress accumulated on a wafer at various stages in the BEOL Cu/Low-k wafer processing.

It is evident from FIG. 2 that the tensile stresses on the wafer keep increasing in the wafer as more and more metallization steps are added to the film and the wafer experiences maximum tensile stress during deposition of the Aluminum pad. Aluminum and copper are known to contribute to tensile stresses, while the dielectric films can contribute to tensile or compressive stresses based on deposition conditions like temperature, time, etc. As the tensile stresses in the wafer build-up, the wafer can bow due to the warpage or macro stress distributions from the center to the edge of the wafer. However, the local stress distribution in the Aluminum pads is harder to characterize.

OBJECTS AND SUMMARY

An object of an embodiment of the present invention is to reduce or eliminate IMC cracking in post wire bonded dies.

Another object of an embodiment of the present invention is to provide a bond pad structure which reduces or eliminates IMC cracking in post wire bonded dies.

Briefly, and in accordance with at least one of the foregoing objects, an embodiment of the present invention provides a bond pad structure which includes an aluminum bond pad which include one or more dopants that effectively control the growth of IMC to a nominal level in spite of high tensile stresses in the wafer. For example, aluminum can be doped with 1–2 atomic % of Mg. Alternatively, Pd or Si can be used, or elements like Cu or Si can be used as the dopant in order to reduce the overall tensile stresses in the wafer. This can control the abnormal growth of IMC, thus arresting the IMC crack formation.

A combination of dopants can be used to both control the tensile stresses and also slightly alter the gold-Aluminum interface thus enabling a uniform and thin IMC formation. This tends to reduce or eliminate any voiding or cracking which would otherwise occur at the wire bond transfer.

BRIEF DESCRIPTION OF THE DRAWINGS

The organization and manner of the structure and operation of the invention, together with further objects and advantages thereof, may best be understood by reference to the following description, taken in connection with the accompanying drawing, wherein.

DESCRIPTION

Figure 1:
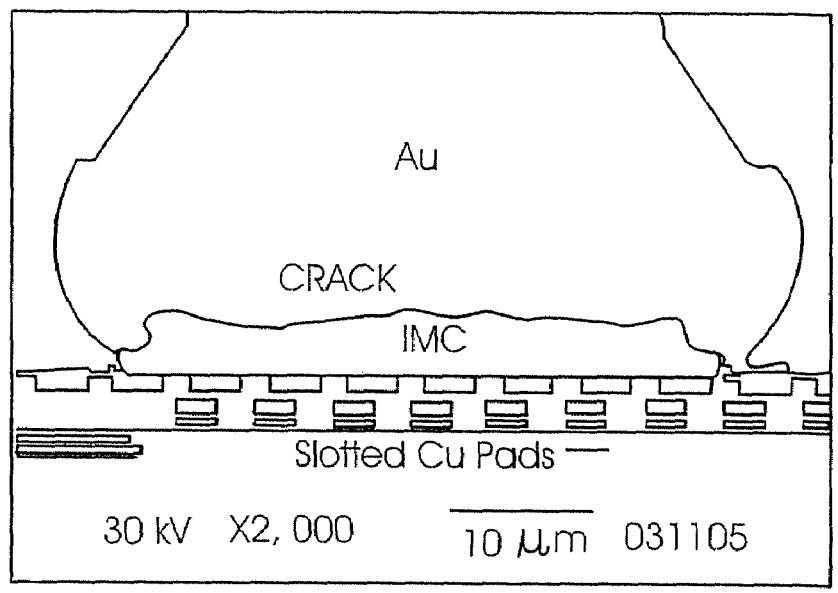
FIG. 1 is an X-SEM of a bonded die, showing IMC cracking.
Figure 2:
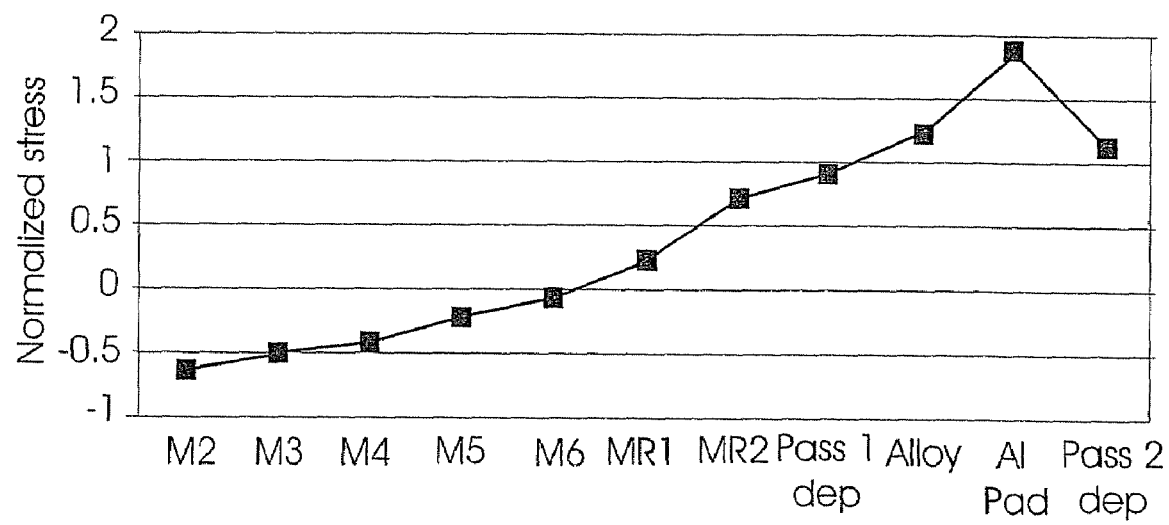
FIG. 2 is a graph which shows normalized stress on a wafer at various metallization steps in the BEOL Cu/Low-k steps, wherein a positive value for stress indicates tensile stress and a negative value for stress indicates compressive stress.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

Figure 3:
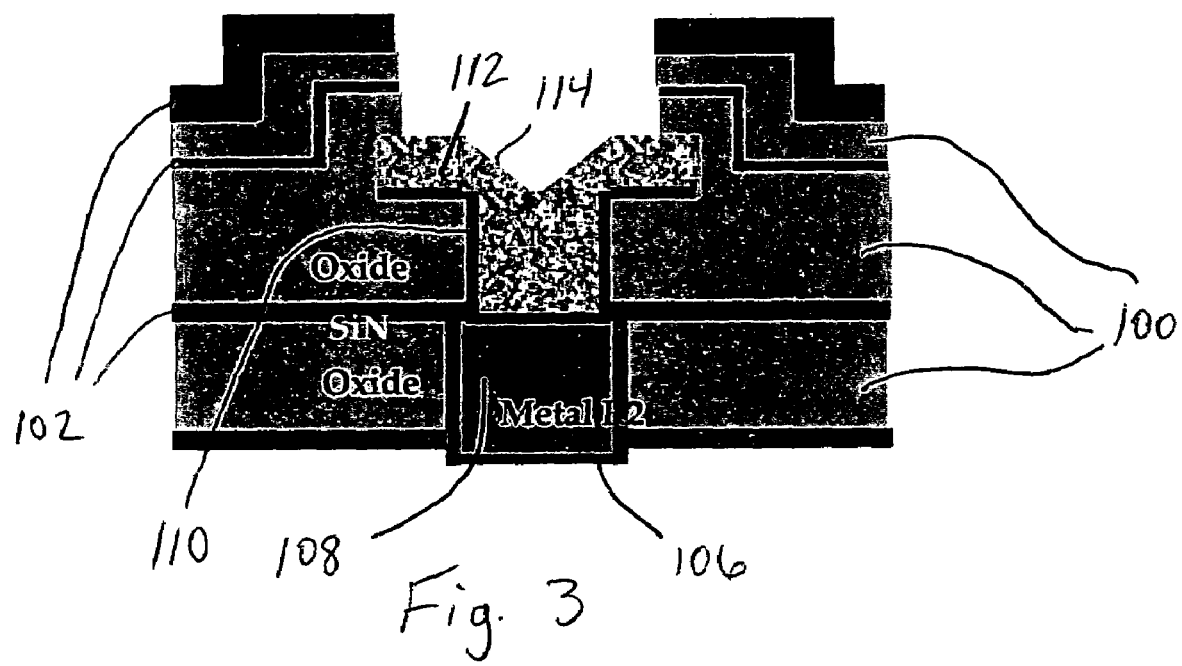
FIG. 3 provides a cross-sectional view of a dual passivation layer scheme which is in accordance with the present invention.

FIG. 3 illustrates a dual passivation layer scheme which is in accordance with an embodiment of the present invention. The scheme includes oxide layers 100, barrier layers 102, a barrier layer 106, a layer of copper 108, another barrier layer 110, and a layer of aluminum 112 which is configured for bonding to a gold ball (see FIG. 1) and hence includes a pad interface 114. In accordance with the present invention, the aluminum layer includes a dopant so that the IMC formed is more uniform and the thickness is controlled in order to reduce or eliminate the IMC cracking issues in wire bonded parts during temperature cycling. Specifically, layer 112 is either:

1. Doped with, for example, 1–2 atomic % of Mg. The Mg along with the aluminum causes a thin Al—Mg layer to be provided at the pad interface 114. This thin film controls the growth of IMC to a more nominal level in spite of high tensile stresses on the wafer. Instead of Mg, Pd or Si can be used as a dopant with the Aluminum.

2. Doped with elements like Cu or Si, which reduces the overall tensile stresses and also slightly alters the gold-aluminum interface (pad interface 114), thus enabling a uniform and thin IMC formation. This reduces or eliminates any voiding or cracking which would otherwise form at the wire bond interface (see FIG. 1).

The present invention provides that a dopant or a combination of dopants is used, with the aluminum, to both control the tensile stresses and also slightly alter the gold-aluminum interface, thus enabling a uniform and thin IMC formation, thereby reducing or eliminating any voiding or cracking which would otherwise occur at the wire bond interface.

While embodiments of the present invention are shown and described, it is envisioned that those skilled in the art may devise various modifications of the present invention without departing from the spirit and scope of the appended claims.

What is claimed is:

1. A bond pad structure for engaging a gold ball, comprising:
   a layer of copper;
   a layer of aluminum disposed above the copper layer and configured for engagement with the gold ball, wherein said layer of aluminum is doped only with Si.

2. The bond pad structure as recited in claim 1, wherein the layer of aluminum is doped such that the growth of intermetallic compound (IMC) is controlled to a nominal level in spite of high tensile stresses on the wafer.

3. The bond pad structure as recited in claim 1, wherein the layer of aluminum is doped with Si, thereby reducing the overall tensile stresses, wherein the gold-aluminum interface is altered, thus enabling a uniform and thin intermetallic compound (IMC) formation.

* * * * *

UNITED STATES PATENT AND TRADEMARK OFFICE
CERTIFICATE OF CORRECTION

PATENT NO.        : 7,205,673 B1                                    Page 1 of 1
APPLICATION NO.   : 11/283044
DATED             : April 17, 2007
INVENTOR(S)       : Jayanthi Pallinti et al.

It is certified that error appears in the above-identified patent and that said Letters Patent is hereby corrected as shown below:

Title Page

(75)  Inventors:    "Jayanthi Pallinti, Dilip Vijay,
                    Hemanshu Bhatt, Sey-Shing Sun,
                    Hong Ying, Chiyi Kao"

should be:

--      Jayanthi Pallinti, Dilip Vijay,
                    Hemanshu Bhatt, Sey-Shing Sun,
                    Hong Ying, Chiyi Kao,
                    Ramaswamy Ranganathan and Qwai Low --

Signed and Sealed this

Twenty-third Day of December, 2008

JON W. DUDAS
*Director of the United States Patent and Trademark Office*